United States Patent [19]

Beam, III

[11] Patent Number: 5,342,804
[45] Date of Patent: Aug. 30, 1994

[54] METHOD OF FABRICATION OF DEVICES WITH DIFFERENT OPERATING CHARACTERISTICS THROUGH A SINGLE SELECTIVE EPITAXIAL GROWTH PROCESS

[75] Inventor: Edward A. Beam, III, Dallas, Tex.

[73] Assignee: Texas Instruments Incorporated, Dallas, Tex.

[21] Appl. No.: 64,777

[22] Filed: May 19, 1993

[51] Int. Cl.$^5$ .............................. H01L 21/20
[52] U.S. Cl. ........................ 437/89; 437/90; 437/157; 437/205; 437/904; 257/9; 148/DIG. 106; 148/DIG. 143
[58] Field of Search ............... 437/80, 89, 157, 205, 437/904, 909, 54; 257/9; 148/DIG. 106, DIG. 143

[56] References Cited

U.S. PATENT DOCUMENTS

| | | | |
|---|---|---|---|
| 4,147,573 | 4/1979 | Morimoto | 437/904 |
| 4,426,767 | 1/1984 | Swanson et al. | 437/90 |
| 4,549,926 | 10/1985 | Corboy, Jr. et al. | 437/89 |
| 4,637,127 | 1/1987 | Kurogi et al. | 437/89 |

OTHER PUBLICATIONS

G. Coudenys, G. Vermeire, Y. Zhu I. Moerman, L. Buydens, P. Van Daele, and P. Demeester, "Novel Growth Techniques for the Fabrication of Photonic Integrated Circuits", *Mat. Res. Soc. Symp. Proc.*, vol. 240, pp. 15-26, 1992.

A. Christou and H. S. Ruppercht, "Gallium Arsenide and Related Compounds 1987", *Instiute of Physics Conference Series Number 91*, pp. 183-186, Sep. 28, 1987-Oct. 1, 1987.

O. Kayser, R. Westphalen, B. Opitz and P. Balk, "Control of Selective Area Growth of InP", *Journal of Crystal Growth*, 112, pp. 111-122, 1991.

Y. D. Galeuchet and P. Roentgen, "Selective Area MOVPE of GaInAs/InP Heterostructures on Masked and Nonplanar (100) and (111) Substrates", *Journal of Crystal Growth*, 107, pp. 147-150, 1991.

C. Blaauw, A. Szaplonczay, K. Fox, and B. Emmerstorfer, "MOCVD of InP and Mass Transport on Structured InP Substrates", *Journal of Crystal Growth*, 77, pp. 326-333, 1986.

K. Azoulay, N. Bouadma, J. C. Bouley, and L. Dugrand, "Selective MOCVD Epitaxy for Optoelectronic Devices", *Journal of Crystal Growth*, 55, pp. 229-234, 1981.

Jan-Otto Carlsson, "Selective Vapor-Phase Deposition on Patterned Substrates", *Solid State and Materials Sciences*, vol. 16, Issue 3, pp. 161-212, 1990.

*Primary Examiner*—R. Bruce Breneman
*Assistant Examiner*—Ramamohan Rao Paladugu
*Attorney, Agent, or Firm*—Richard A. Stoltz; Richard L. Donaldson; René E. Grossman

[57] ABSTRACT

A semiconductor device structure (10) includes similar devices (30), (32), and (34) having different operating characteristics. Each similar device is formed on a semiconductor substrate layer (14) through openings (16), (18), and (20) in a mask layer (12). Each opening (16), (18), and (20) has a different feature size and spacing that allows for various thickness levels of layers within the similar devices (30), (32), and (34) due to desorption from the mask layer (12). The growth rate within each opening (16), (18), and (20) is inversely proportional to the feature size of the respective opening.

8 Claims, 1 Drawing Sheet $V_{BD_A} > V_{BD_B} > V_{BD_C}$

METHOD OF FABRICATION OF DEVICES WITH DIFFERENT OPERATING CHARACTERISTICS THROUGH A SINGLE SELECTIVE EPITAXIAL GROWTH PROCESS

TECHNICAL FIELD OF THE INVENTION

The present invention relates in general to semiconductor devices and fabrication and more particularly to devices with different operating characteristics through a single selective epitaxial growth process and method of fabrication.

BACKGROUND OF THE INVENTION

Conventional fabrication processes of multiple semiconductor devices on the same substrate layer are limited to making the same devices on the substrate layer with the same properties. Methods to change the operating characteristics of similar devices and epitaxial layers have been limited to post growth processing techniques including changes in area, ion implantation, and diffusion. It is therefore desirable to change the operating characteristics of similar devices on a single substrate layer without implementing post growth processing techniques.

SUMMARY OF THE INVENTION

From the foregoing, it may be appreciated that a need has arisen for similar devices on a single substrate layer that have different operating characteristics. A need has also arisen to fabricate such devices without employing post growth processing techniques.

In accordance with the present invention, similar devices with different operating characteristics through a single selective epitaxial growth process and method of fabrication are provided which substantially eliminate or reduce disadvantages and problems associated with conventional device fabrication.

According to an embodiment of the present invention, there is provided a method of producing similar devices having different operating characteristics in a single selective epitaxial growth that includes forming a substrate layer and selectively masking the substrate layer. A plurality of openings remain through the mask formed on the substrate layer and epitaxial layers are grown within each opening. The epitaxial layer thickness is varied within each opening such that a similar device is formed within each opening. Each similar device has different operating characteristics due to the variances in epitaxial layer thickness.

The method and device of the present invention provide various technical advantages over conventional semiconductor devices and fabrication methods. For example, one technical advantage is in obtaining similar devices having different operating characteristics in a single selective epitaxial growth. Another technical advantage is in eliminating post growth processing techniques to change the operating characteristics of similar devices in epitaxial layers. Yet another technical advantage is to vary the epitaxial layer thickness within each opening to obtain the different operating characteristics. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
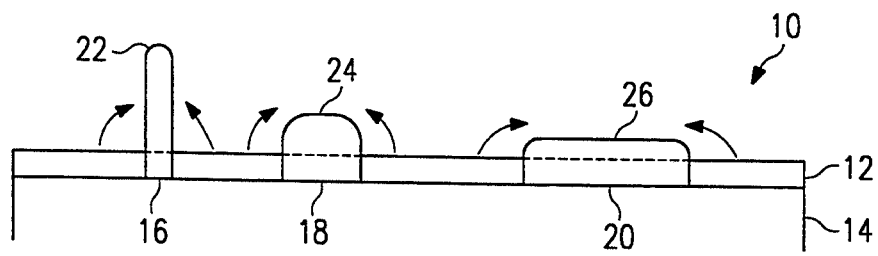
FIG. 1 illustrates a schematic sectional view of a semiconductor substrate with varying thickness areas of epitaxial growth.

FIG. 1 is a schematic sectional diagram of a semiconductor device structure 10 in the initial stages of fabrication. Semiconductor device structure 10 includes a mask layer 12 formed on a semiconductor substrate layer 14. Mask layer 12 is formed to have openings 16, 18, and 20 to semiconductor substrate layer 14. Epitaxial layers 22, 24, and 26 are grown onto mask 12 and openings 16, 18, and 20, respectively. Though only three openings are shown, mask layer 12 may have any number of openings to semiconductor substrate layer 14 as desired.

Openings 16, 18, and 20 are selected to have different feature sizes and openings 16, 18, and 20 have separate spacings between each other. During epitaxial growth, epitaxial layers 22, 24, and 26 are grown onto openings 16, 18, and 20, respectively, and also onto mask layer 12. Epitaxial growth onto mask layer 12 is desorbed onto epitaxial layers 22, 24, and 26 from the vicinity of openings 16, 18, and 20, respectively. The variation in growth rates among epitaxial layers 22, 24, and 26 is attributed to locally varying gas phase diffusion concentration gradients resulting from the desorption of reactants from mask layer 12 in the vicinity of openings 16, 18, and 20 onto epitaxial layers 22, 24, and 26. Increased growth rates occur with respect to a decreased area of an opening. This results in the taller thickness of epitaxial layer 22 at opening 16 as compared to epitaxial layer 24 at opening 18 as compared to epitaxial layer 26 at opening 20.

Figure 2:
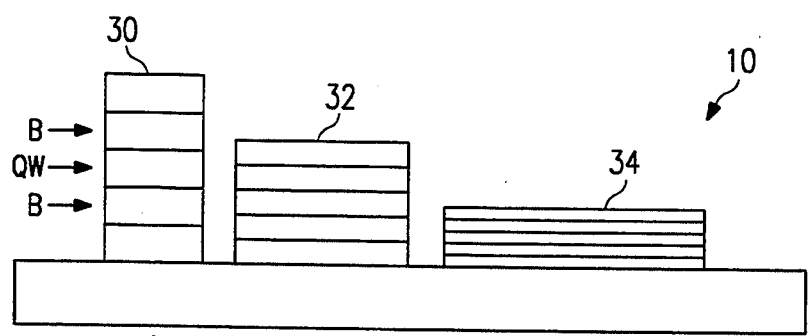
FIG. 2 illustrates a schematic sectional view of resonant tunneling diode devices fabricated onto the semiconductor substrate.

FIG. 2 is a schematic sectional diagram of semiconductor device structure 10 depicting actual devices. Semiconductor device structure 10 includes double barrier resonant tunneling diodes 30, 32, and 34 fabricated by selective area epitaxial growth shown in FIG. 1. Resonant tunneling diodes 30, 32, and 34 are formed with a double barrier B surrounding a quantum well QW. The variation in quantum well layer thicknesses or barrier layer thicknesses between resonant tunneling diodes 30, 32, and 34, as fabricated by the selective area epitaxial growth technique, establishes different operating characteristics between the three resonant tunneling diodes shown.

Figure 3:
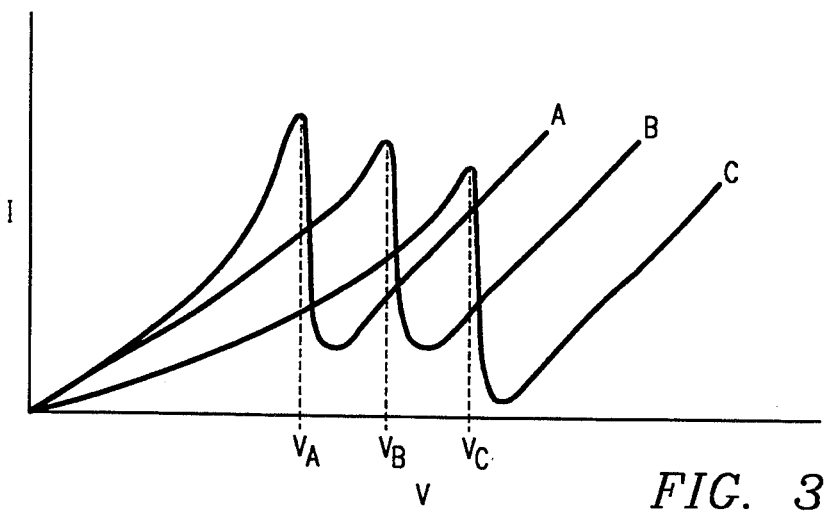
FIG. 3 illustrates a graph of varying resonance voltage characteristics for the resonant tunneling diode devices.

FIG. 3 is a graph of the current-voltage characteristics for each resonant tunneling diode. As shown in the graph, resonant tunneling diodes 30, 32, and 34 have different current voltage characteristics. Layer thickness variations between the resonant tunneling diodes result in different peak resonance voltages $V_A$, $V_B$, and $V_C$ for resonant tunneling diodes 30, 32, and 34, respectively. Thus, by varying an area and spacing of an opening within mask layer 12 as shown by openings 16, 18, and 20, semiconductor device structure 10 may be fabricated having similar devices with different operating characteristics. There is no need for post growth processing techniques to change operating characteristics since different operating characteristics have been established during the selective area epitaxial growth process. However, post growth processing could be used to adjust or fine tune operating characteristics as desired.

Figure 4:
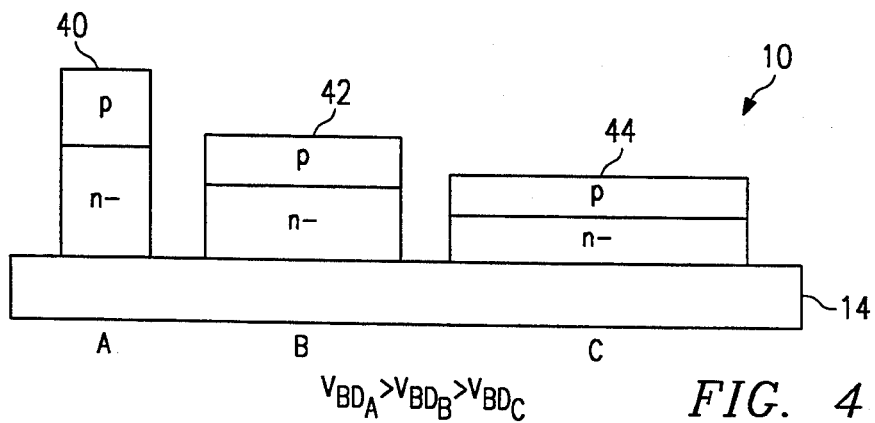
FIG. 4 illustrates a schematic sectional view of P-N diode devices fabricated on the semiconductor substrate layer.

FIG. 4 is a sectional schematic diagram of semiconductor device structure 10 with different diode devices. Semiconductor device structure 10 includes diodes 40, 42, and 44 grown on semiconductor substrate layer 14 into openings 16, 18, and 20, respectively. As previously shown, the selective area epitaxial growth process results in devices having variations in epitaxial layer thickness. For diode devices 40, 42, and 44, the variations in layer thickness result in differences in breakdown voltages between the devices. The greater thickness of diode 40 results in a breakdown voltage greater than the breakdown voltage of diode 42 and, similarly, the breakdown voltage of diode 44. Thus, by varying the feature size and spacing of openings within mask layer 12 multiple devices can be formed on semiconductor substrate layer 14 having different operating characteristics. Though FIG. 4 shows diode devices, transistor devices can equally be fabricated with different operating characteristics.

The resonant tunneling diode devices of FIG. 2 and the diode/transistor devices of FIG. 4 are suitable for analog-to-digital converter applications. The resonant tunneling diodes and the diode/transistors can be formed into an analog-to-digital converter type device that employs the different operating characteristics formed during the selective area epitaxial growth process.

In summary, similar devices can be fabricated on a semiconductor device structure wherein each device has different operating characteristics. The different operating characteristics result from variations in layer thicknesses between the devices achieved during a selective area epitaxial growth process. Resonant tunneling diodes with varying resonance voltages and diode/-transistors with varying breakdown voltages may be fabricated on the same semiconductor substrate layer. The different operating characteristics between devices is applicable to analog-to-digital converter type applications.

Thus, it is apparent that there has been provided, in accordance with the present invention, a semiconductor device structure and method of fabrication that satisfies the advantages set forth above. Although the preferred embodiment has been described in detail, it should be understood that various changes, substitutions, and alterations can be made herein without departing from the spirit and scope of the present invention as defined by the following claims.

What is claimed is:

1. A method of producing similar devices having different operating characteristics in a single selective epitaxial growth, comprising the steps of:
   forming a substrate layer;
   selectively masking the substrate layer to form a mask on the substrate layer, the mask having at least a first and a second opening;
   growing an epitaxial layer within each opening with a different epitaxial layer thickness in said openings; and
   forming a similar device within each opening, each similar device having different operating characteristics due to a variance in epitaxial layer thickness between each opening.

2. The method of claim 1, wherein each opening has a different feature size.

3. The method of claim 1, wherein each similar device is a diode.

4. The method of claim 3, wherein each similar device has a different breakdown voltage.

5. The method of claim 1, wherein each similar device is a resonant tunnelling diode.

6. The method of claim 5, wherein each similar device has a different resonance voltage.

7. The method of claim 1, wherein each similar device is a transistor.

8. The method of claim 1, wherein the mask has separate distances between each opening.

* * * * *